United States Patent [19]
Kato

[11] Patent Number: 5,986,326
[45] Date of Patent: Nov. 16, 1999

[54] SEMICONDUCTOR DEVICE WITH MICROWAVE BIPOLAR TRANSISTOR

[75] Inventor: Hirosi Kato, Tokyo, Japan

[73] Assignee: NEC Corporation, Tokyo, Japan

[21] Appl. No.: 09/105,409

[22] Filed: Jun. 26, 1998

[30] Foreign Application Priority Data

Jun. 27, 1997 [JP] Japan ..................................... 9-172386

[51] Int. Cl.⁶ .................................................. H01L 29/73
[52] U.S. Cl. ........................... 257/593; 257/587; 257/592
[58] Field of Search .................................. 257/593, 587, 257/588, 585, 554, 630, 488, 592

[56] References Cited

U.S. PATENT DOCUMENTS

| | | | |
|---|---|---|---|
| 5,391,905 | 2/1995 | Yamazaki et al. | 257/370 |
| 5,500,554 | 3/1996 | Sato | 257/588 |
| 5,717,227 | 2/1998 | Kim | 257/139 |

FOREIGN PATENT DOCUMENTS

| | | |
|---|---|---|
| 298632 | 8/1990 | Japan . |
| 2246223 | 10/1990 | Japan . |
| 5136434 | 6/1993 | Japan . |
| 6342801 | 12/1994 | Japan . |

Primary Examiner—John Guay

[57] ABSTRACT

A semiconductor device with a bipolar transistor that decreases the parasitic capacitance between a base connection layer and a collector region is provided. This device is comprised of a semiconductor substrate having a main surface, a collector region formed in the substrate, a base region formed in the substrate, an emitter region formed in the substrate, a first dielectric layer formed on the main surface of the substrate to be overlapped with the collector region, a conductive layer formed on the first dielectric layer and applied with a specific electric potential, a second dielectric layer formed to cover the conductive layer, a base connection layer formed on the second dielectric layer and electrically connected to the base region, and a base electrode electrically connected to the base connection layer. The emitter region, the base region, and the collector region constitute a bipolar transistor. The conductive layer serves as a shielding electrode that prevents a parasitic capacitance between the collector region and the base connection layer from occurring using the Faraday shielding effect.

10 Claims, 10 Drawing Sheets

SEMICONDUCTOR DEVICE WITH MICROWAVE BIPOLAR TRANSISTOR

BACKGROUND OF THE INVENTION

1. Field of the Invention

The present invention relates to a semiconductor device and more particularly, to a semiconductor device with a bipolar transistor operable in the microwave region, in which the parasitic capacitance of the transistor is reduced.

2. Description of the Prior Art

In general, the power gain $|S_{21e}|^2$ of a bipolar transistor operated in a High-Frequency (HF) range whose frequency f is several hundreds MHz or greater, which is termed a microwave bipolar transistor, is expressed by the following equation (1).

$$|S_{21e}|^2 = \left( \frac{2Z_u}{\gamma_b' + \gamma_e + Z_0} \cdot \frac{2\pi f_T}{2\pi f (1 + 2\pi f_T \cdot C_{CB} \cdot Z_0)} \right)^2 \quad (1)$$

In the equation (1), $Z_0$ is the characteristic impedance. $f_T$ is the cutoff or transition frequency, $\gamma_b$ is the base resistance, $\gamma_e$ is the emitter resistance, and $C_{CB}$ is the collector-base capacitance.

It is seen from the equation (1) that the power gain $|S_{21e}|^2$ is strongly dependent upon the collector-base capacitance $C_{CB}$. Thus, to increase the power gain $|S_{21e}|^2$ by means of reducing the collector-base capacitance $C_{CB}$, some improved transistor structures have been developed and disclosed.

Figure 1:
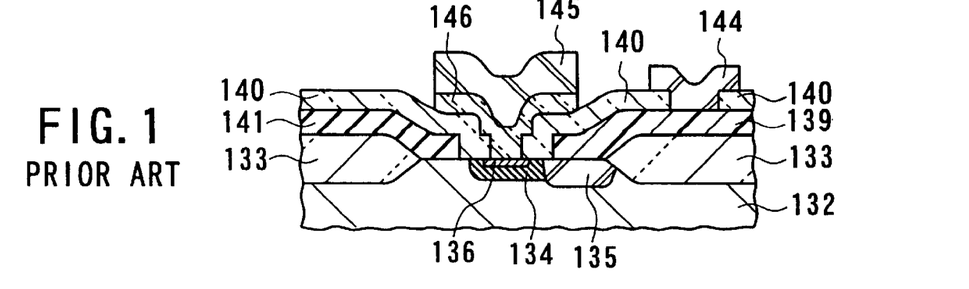
FIG. 1 is a partial cross-sectional view of a first conventional semiconductor device.

FIG. 1 shows a first example of the conventional improved transistor structures, which is disclosed in the Japanese Non-Examined Patent Publication No. 2-246223 published in 1990.

As shown in FIG. 1, a field oxide 133 is selectively formed on a semiconductor substrate 132 to define a device region in the surface area of the substrate 132. An intrinsic base region 134 is formed in the device region of the substrate 132. An emitter region 136 is formed in the device region of the substrate 132 to be surrounded by the intrinsic base region 134.

An emitter contact layer 146 is formed on a silicon dioxide ($SiO_2$) layer 140 to be contacted with and electrically connected to the emitter region 136. An emitter electrode 145 is formed on the emitter contact layer 146 to be electrically connected to the emitter region 136 through the emitter contact layer 146.

An extrinsic base region 135 is formed in the device region of the substrate 132 to be contacted with the intrinsic base region 134. As seen from FIG. 1, the extrinsic base region 135 is located at only one side (i.e., the right-hand side in FIG. 1) of the intrinsic base region 134. The extrinsic base region 135 is electrically connected to a base electrode 144 through a base connection layer 139 formed on the field oxide 133.

At an opposite side of the intrinsic base region 134 to the extrinsic base region 135, a high-resistivity layer 141 is formed on the field oxide 133 to be contacted with the device region of the substrate 136.

A $SiO_2$ layer 140 is formed on the field oxide 133 to be contacted with the device region of the substrate 132. The emitter contact layer 146 and the base electrode 144 are formed on the $SiO_2$ layer 140.

As described above, the conventional bipolar transistor shown in FIG. 1 has a so-called "single base structure" and therefore, the capacitance of the base-collector junction is decreased compared with the case where the extrinsic base region 135 is provided at both sides of the intrinsic base region 134.

However, with the conventional bipolar transistor shown in FIG. 1, because the base connection layer 139 is formed to extend over the device region of the substrate 132 serving as the collector region through the field oxide 153, a parasitic capacitance will occur between the base connection layer 139 and the substrate 132. This parasitic capacitance causes a problem that the power gain $|S_{21e}|^2$ in a HF region is lowered.

Figure 2:
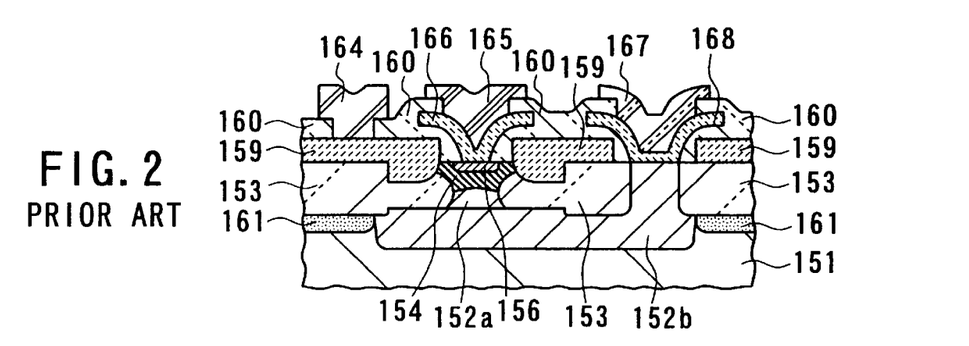
FIG. 2 is a partial cross-sectional view of a second conventional semiconductor device.

FIG. 2 shows a second example of the conventional improved transistor structures, which is disclosed in the Japanese Non-Examined Patent Publication No. 6-342801 published in 1994.

As shown in FIG. 2, a field oxide 153 is selectively formed on a silicon substrate 151 to define a device region in the surface area of the substrate 151. A channel stop region 161 is formed below the field oxide 143. The device region of the substrate 151 serves as a collector region 152a and a collector connection region 152b.

A base region 154 and an emitter region 156 are formed in the device region of the substrate 151. The base region 154 is located on the collector region 152a and the emitter region 156 is surrounded by the base region 154.

The collector connection region 152b is electrically connected to a collector electrode 167 through a collector contact layer 168 made of polysilicon. The emitter region 156 is electrically connected to an emitter electrode 165 through an emitter contact layer 166 made of polysilicon. The base region 154 is electrically connected to a base electrode 164 through a base connection layer 159 made of polysilicon. The base connection layer 159 is formed on the thick field oxide 153, As described above, with the conventional bipolar transistor shown In FIG. 2, the base region 154 is laterally contacted with and electrically connected to the base connection layer 159, extending over the thick field oxide 153 and therefore, the size of the base region 154 can be reduced. As a result, the capacitance of the collector-base junction in the device region is lowered.

However, because the base connection layer 159 is formed to extend over the collector region 152a and the connection region 152b, a parasitic capacitance will occur between the base connection layer 159 and the collector region 152a and the collector connection region 152b. This parasitic capacitance causes the same problem as above, FIG. 3 shows a third example of the conventional improved transistor structures, which is disclosed in the Japanese Non-Examined Patent Publication No. 5-136434 published in 1993.

Figure 3:
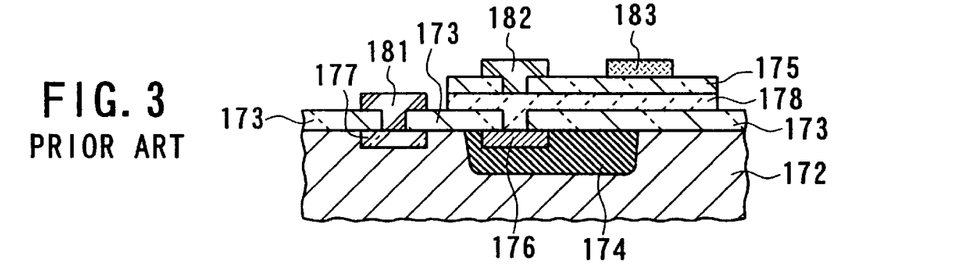
FIG. 3 is a partial cross-sectional view of a third conventional semiconductor device.

As shown in FIG. 3, abase region 174 is formed in an n-type epitaxial layer 172 that serves as a collector region. An emitter region 176 is formed in the epitaxial layer 172 to be surrounded by the base region 174. A collector connection region 177 is formed in the epitaxial layer 172.

A dielectric layer 173 is formed on the epitaxial layer 172. A collector electrode 181 is formed on the dielectric layer 173 to be contacted with and electrically connected to the collector connection region 177. A conductive layer 178 is formed on the dielectric layer 173 to be contacted with and electrically connected to the emitter region 176.

An interlayer dielectric layer 175 is formed on the conductive layer 178. An emitter electrode 182 is formed on the interlayer dielectric layer 175 to be contacted with and electrically connected to the conductive layer 178. Thus, the emitter electrode 182 is electrically connected to the emitter region 16 through the conductive layer 178.

A wiring layer 183 for a signal or signals is formed on the interlayer dielectric layer 175 to be overlapped with the underlying conductive layer 178.

As described above, with the conventional bipolar transistor shown in FIG. 3, the transistor is used as a collector-emitter (C–E) diode while the base region 174 is kept electrically open. The conductive layer 178, which is electrically connected to the emitter region 176, is located on the dielectric layer 173 and at the same time, the wiring layer 183 is located to be overlapped with the conductive layer 178 through the interlayer dielectric layer 175. Thus, a parasitic capacitance between the wiring layer 183 and the base region 174 is generated.

As clearly seen from the above explanation, the conventional bipolar transistor shown in FIG. 3 does not have the structure to decrease the collector-base capacitance $C_{CB}$.

Figure 4:
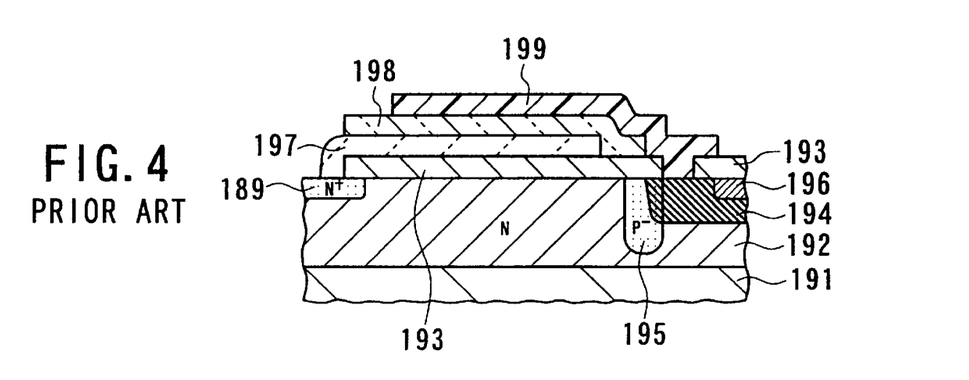
FIG. 4 is a partial cross-sectional view of a fourth conventional semiconductor device.

FIG. 4 shows a fourth example of the conventional improved transistor structures, which is disclosed in the Japanese Non-Examined Utility-Model Publication No. 2-98632 published in 1990.

As shown in FIG. 4, an n-type collector region 192 is formed on a silicon substrate 191. In the collector region 192, a p-type base region 194, a p⁻-type region 195, an n-type emitter region 196, and an n⁺-type region 189 are formed. The base region 194 is contacted with the p⁻-type region 195.

A SiO₂ layer 193 is formed on the collector region 192. A conductive layer 197 is formed on the SiO₂ layer 193 to be contacted with and electrically connected to the n⁺-type region 189. An interlayer dielectric layer 198 is formed to cover the conductive layer 197.

A base connection layer 199 is formed on the interlayer dielectric layer 198 to be contacted with and electrically connected to the base region 194. The base connection layer 199 is overlapped with the underlying conductive layer 197, resulting in an intentional parasitic capacitance between the base and collector regions 194 and 192.

With the conventional transistor structure shown in FIG. 4, because the conductive layer 197 is formed to extend over the collector region 192 through the SiO₂ layer 193, a parasitic capacitance will occur between the conductive layer 197 and the collector region 192. This parasitic capacitance causes the same problem as above.

SUMMARY OF THE INVENTION

Accordingly, an object of the present invention is to provide a semiconductor device with a bipolar transistor that decreases the parasitic capacitance between a base connection layer and a collector region.

Another object of the present invention is to provide a semiconductor device with a bipolar transistor that increases the power gain in the HF frequency range.

The above objects together with others not specifically mentioned will become clear to those skilled in the art from the following description.

A semiconductor device according to the present invention is comprised of a semiconductor substrate having a main surface, a collector region formed in the substrate, a base region formed in the substrate, an emitter region formed in the substrate, a first dielectric layer formed on the main surface of the substrate to be overlapped with the collector region, a conductive layer formed on the first dielectric layer and applied with a specific electric potential, a second dielectric layer formed to cover the conductive layer, a base connection layer formed on the second dielectric layer and electrically connected to the base region, and a base electrode electrically connected to the base connection layer.

The emitter region, the base region, and the collector region constitute a bipolar transistor.

The conductive layer serves as a shielding electrode that prevents a parasitic capacitance between the collector region and the base connection layer from occurring using the Faraday shielding effect.

With the semiconductor device according to the present invention, the parasitic capacitance between the collector region and the base connection layer is prevented from occurring due to the Faraday shielding effect. Therefore, a parasitic capacitance between the base connection layer and the collector region is decreased or canceled. This means that the power gain of the bipolar transistor in the HF frequency range is increased.

In a preferred embodiment of the semiconductor device according to the present invention, the base region is comprised of a first part serving as an intrinsic base and a second part serving as an extrinsic base. The base connection layer is electrically connected to the second part of the base region. The base connection layer is formed to surround the first part of the base region. The emitter region and the collector region are contacted with the first part of the base region.

In this case, the advantages of the present invention is effectively brought out.

In another preferred embodiment of the semiconductor device according to the present invention, the second part of the base region is formed to surround the first part of the base region.

In this case, there is an additional advantage that the electric resistance of the base region is lowered.

In still another preferred embodiment of the semiconductor device according to the present invention, the base connection layer is entirely overlapped with the conductive layer except for a neighborhood of the base connection layer with the base region. The neighborhood of the base region surrounds the base region.

In this case, the Faraday shielding effect is effectively utilized.

The neighborhood of the base region preferably has a width L equal to or greater than 1 μm. This is because the Faraday shielding effect is effectively utilized.

In a further preferred embodiment of the semiconductor device according to the present invention, the base connection layer is electrically connected to the emitter region.

In this case, there is an additional advantage that no dedicated wiring line is required for applying the specific electric potential to the base connection layer.

The base connection layer may be electrically connected to a power supply line or a ground line.

The base connection layer is preferably made of polysilicon or a metal silicide such as a silicide of tungsten (W), titanium (Ti), or platinum-rhodium alloy (Pt-Rh).

The conductive layer is preferably made of polysilicon, or a metal silicide such as a silicide of tungsten (W), titanium (Ti), or platinum-rhodium alloy (Pt-Rh).

The first dielectric layer is made of silicon oxide (SiO$_x$), silicon nitride (SiN$_x$), or a combination of silicon oxide (SiO$_x$) and silicon nitride (SiN$_x$).

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

PRINCIPLE

Figure 5:
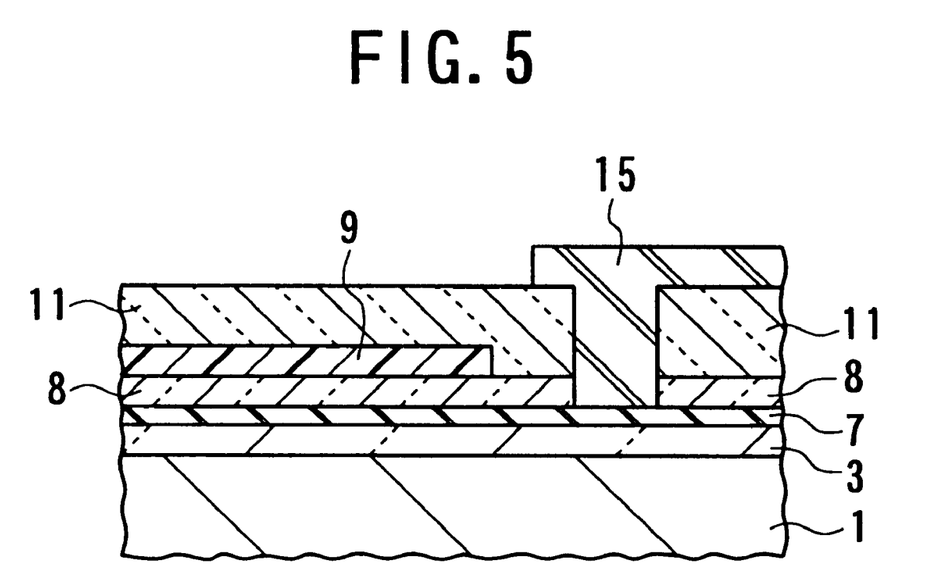
FIG. 5 is a partial cross-sectional view of a semiconductor device according to the present invention, which schematically shows the principle of the present invention.

As shown in FIG. 5, an isolation oxide 3 made of $SiO_2$ is formed on a main surface of a single-crystal silicon substrate 1. A conductive layer 7, which serves as a shielding electrode, is formed on the main surface of the substrate 1. A dielectric layer 8 made of $SiO_2$ is formed on the conductive layer 7. A base connection layer 9 is formed on the dielectric layer 8. A dielectric layer 11 made of $SiO_2$ is formed on the dielectric layer 8 to cover the base connection layer 9. An emitter electrode 15 is formed on the dielectric layer 11. The emitter electrode 15 is contacted with and electrically connected to the conductive layer or shielding electrode 7 through a contact hole penetrating the dielectric layers 11 and 8.

With the semiconductor device according to the present invention, as described above, the conductive layer 7 is electrically connected to the emitter electrode 15 and therefore, the electric potential at the emitter electrode is always applied to the conductive layer 7. Thus, the conductive layer 7 serves as a Faraday shield or Faraday screen provided between the substrate 1 and the base connection layer 9.

As a result, the parasitic capacitance between the substrate 1 (which serves as the collector region) and the base connection layer 9 is prevented from occurring due to the Faraday shielding effect.

FIRST EMBODIMENT

Figure 6:
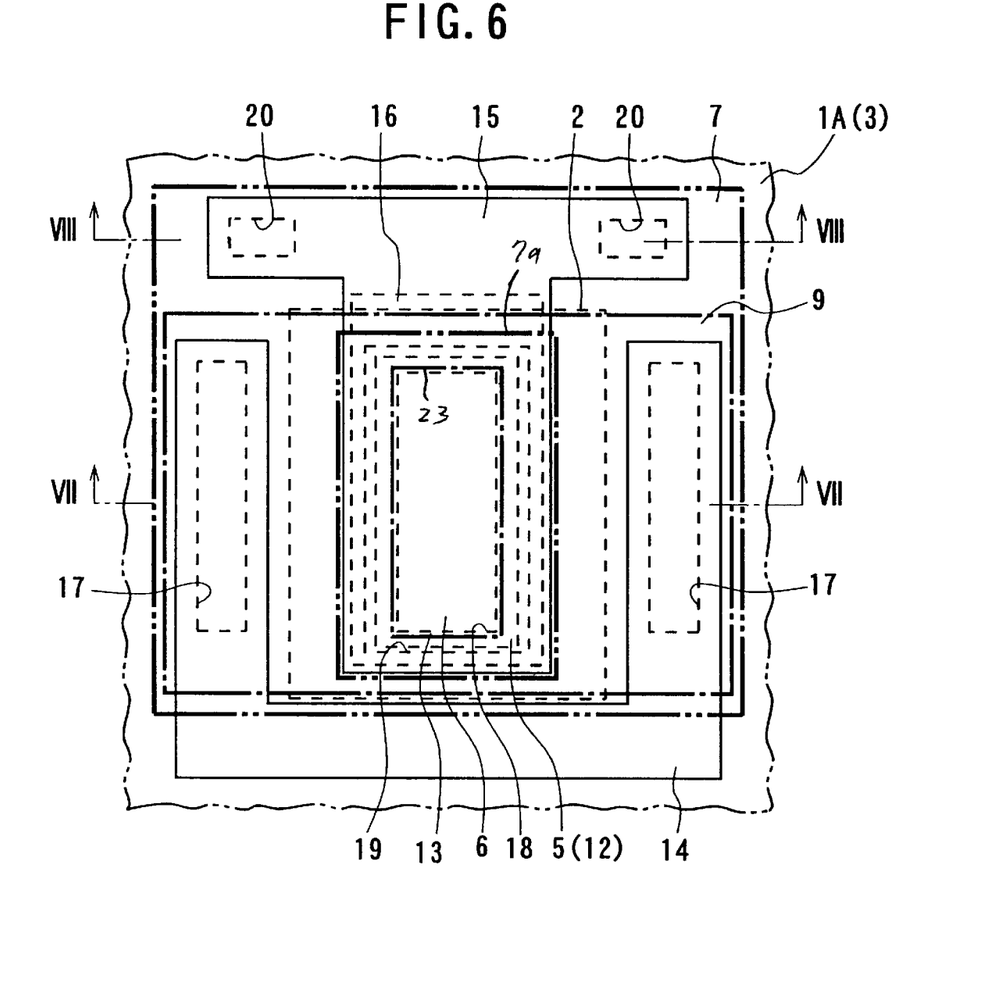
FIG. 6 is a partial plan view of a semiconductor device according to a first embodiment of the present invention.
Figure 7:
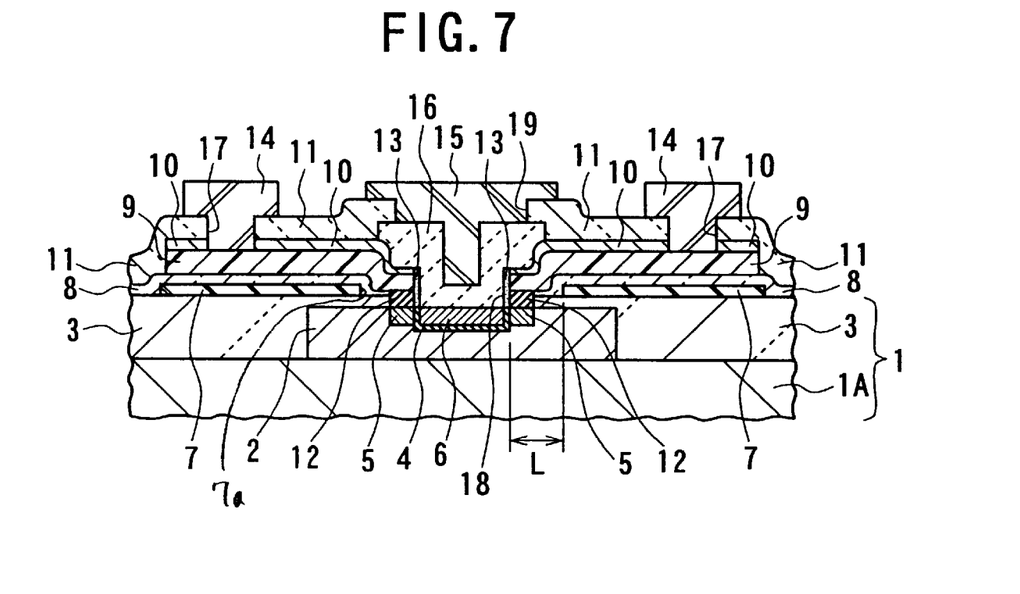
FIG. 7 is a partial cross-sectional view of the semiconductor device according to the first embodiment, which is along the line VII—VII in FIG. 6.
Figure 8:
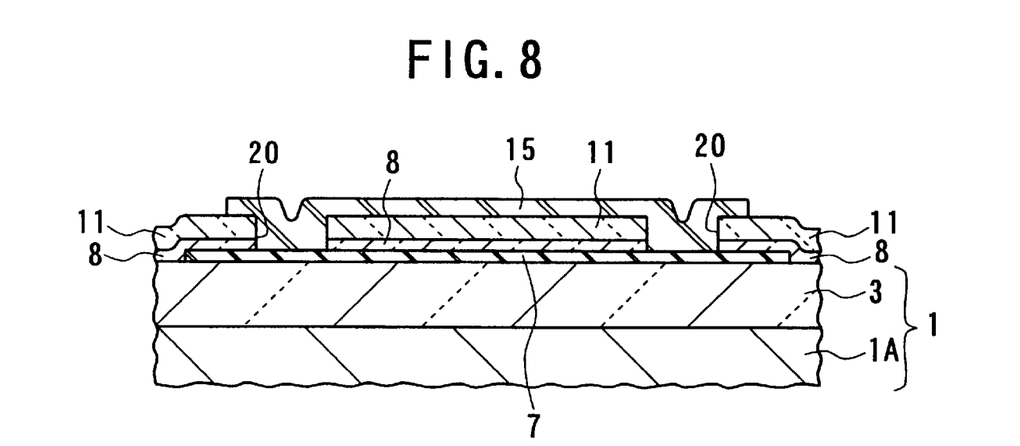
FIG. 8 is a partial cross-sectional view of the semiconductor device according to the first embodiment, which is along the line VIII—VIII in FIG. 6.

FIGS. 6 to 8 show a semiconductor device according to a first embodiment of the present invention.

As clearly shown in FIGS. 7 and 8, an n-type single-crystal silicon (Si) epitaxial layer 2 is formed on an n-type single-crystal Si base 1A, thereby forming an n-type single-crystal Si substrate 1. The n-type base 1A is doped with antimony (Sb) at a doping concentration of $1 \times 10^{18}$ $cm^{-3}$. The n-type epitaxial layer 2 is doped with phosphorus (P) at a doping concentration of $1 \times 10^{15}$ $cm^{-3}$.

An isolation oxide 3, which is made of $SiO_2$ and has a thickness of approximately 1 $\mu$m is formed on the Si base 1A to pattern the epitaxial layer 2. The patterned epitaxial layer 2, which has a thickness of 1 $\mu$m, serves as an n-type collector region 2 of an npn-type bipolar transistor, The collector region 2 is entirely buried in the isolation oxide 3.

An n-type emitter region 6, which is doped with arsenic (As) at a doping concentration of $1 \times 10^{20}$ $cm^{-3}$, is formed in the n-type epitaxial layer 2. The emitter region 6 has a rectangular plan shape, as shown in FIG. 6.

A p-type intrinsic base region 4, which has a peak doping concentration of $1 \times 10^{18}$ $cm^{-3}$, is formed in the n-type epitaxial layer 2. The intrinsic base region 4 is contacted with the bottom and side faces of the emitter region 6. The intrinsic base region 4 has a rectangular plan shape slightly larger than that of the emitter region 6, as shown in FIG. 6.

A $p^+$-type extrinsic base region 5 is formed in the n-type epitaxial layer 2 to surround the intrinsic base region 4. The extrinsic base region 5 has a rectangular-ringed plan shape and is contacted with the entire side faces of the intrinsic base region 4.

A p-type buried polysilicon layer 12 is selectively formed to be buried in the isolation oxide 3 and is located on the extrinsic base region 5. The polysilicon layer 12 has a same rectangular-ringed plan shape as that of the extrinsic base region 5. In other words, the polysilicon layer 12 is completely overlapped with the extrinsic base region 5.

The top of the polysilicon layer 12 is contacted with the inner end of an overlying base connection layer 9, thereby electrically connecting the base connection layer 9 to the extrinsic base region 5 through the polysilicon layer 12. The outer end of the base connection layer 9 is contacted with and electrically connected to a base electrode 14.

The base connection layer 9 is 200 nm in thickness and is made of p-type polysilicon doped with boron (B) at a doping concentration of $1 \times 10^{19}$ $cm^{-3}$. The base connection layer 9 has a rectangular plan shape. The inner end of the base connection layer 9 forms a rectangular base/emitter window 23 through which the emitter region 6 and the intrinsic base region 4 are exposed.

A conductive layer 7 serving as a shielding electrode is formed on the isolation oxide 3, which is located below the base connection layer 9. The conductive layer 7 has a rectangular plan shape to cover the remaining epitaxial layer 2. Further, the conductive layer 7 has a rectangular window 7a through which the emitter region 6 and the intrinsic and extrinsic base regions 4 and 5 are exposed. The conductive layer 7 is 100 nm in thickness and is made of n-type polysilicon doped with arsenic (As) at a doping concentration of $1 \times 10^{20}$ cm$^{-3}$.

A $SiO_2$ layer 8 with a thickness of 100 nm is formed on the isolation oxide 3 to cover the conductive layer 7. The $SiO_2$ layer 8 electrically insulates the conductive layer 7 from the base connection layer 9. The $SiO_2$ layer 8 may be made of silicon nitride ($SiN_x$) or may have a two-layer structure of $SiO_2$ sublayer and $SiN_x$ sublayer.

The inner ends of the buried polysilicon layer 12 and the base connection layer 9 are covered with a silicon nitride ($SiN_x$) layer 13 with a thickness of 120 nm. The $SiN_x$ layer 13, which is located onto the intrinsic base region 4, electrically insulates the buried polysilicon layer 12 and the base connection layer 9 from an emitter contact layer 16.

The emitter contact layer 16 is located on and electrically connected to the emitter region 6. The emitter contact layer 16 is made of an n-type polysilicon. The emitter contact layer 16 is electrically insulated from the base connection layer 9 by a $SiN_x$ layer 10 with a thickness of 100 nm. The $SiN_x$ layer 10 is formed to cover the base connection layer 9. The emitter contact layer 16 is contacted with the emitter region 6 through a contact hole 18 formed by the $SiN_x$ layer 13.

A $SiO_2$ layer 11 is formed to cover the $SiN_x$ layer 10, the base connection layer 9, and the emitter contact layer 16. The $SiO_2$ layer 11 has a thickness of 400 nm.

The base electrode 14 is contacted with and electrically connected to the base connection layer 9 through a contact hole 17 penetrating the $SiO_2$ layer 11 and the $SiN_x$ layer 10.

An emitter electrode 15 is contacted with and electrically connected to the emitter contact layer 16 through a contact hole 19 penetrating the $SiO_2$ layer 11. The emitter electrode 15 has a plan shape like a "T" character, as shown in FIG. 6. Thus, the emitter electrode 15 is contacted with and electrically connected not only to the emitter contact layer 16 but also to the conductive layer 7 serving as the shielding electrode through contact holes 20 penetrating the $SiO_2$ layers 11 and 8.

The rectangular inner end of the conductive layer 7 is laterally apart from the rectangular inner end of the base connection layer 9 by a length L, where L is 0.8 to 1 μm. The base connection layer 9 is entirely overlapped with the conductive layer 7 except for the rectangular-ring-shaped area having a width L. In other words, the base connection layer 9 entirely covers the conductive layer 7 except for the neighborhood of the base connection layer 9 with the base/emitter window 23.

Next, a fabrication method of the semiconductor device according to the first embodiment is explained below with reference to FIGS. 9A to 9G.

Figure 9A:
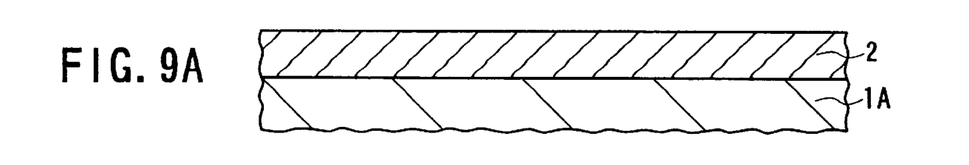
FIGS. 9A to 9G are partial cross-sectional views showing a fabrication method of the semiconductor device according to the first embodiment of FIGS. 6 to 8, respectively.

First, the n-type single-crystal Si substrate 1 is provided by growing the n-type single-crystal Si epitaxial layer 2 on the n-type single-crystal Si base 1A by a Low-Pressure Chemical Vapor Deposition (LPCVD) process, as shown in FIG. 9A.

Then, a $SiN_x$ layer (not shown) with a thickness of 120 nm is formed on the epitaxial layer 2 by a LPCVD process. The $SiN_x$ layer is patterned by photolithography and etching processes, thereby selectively removing a part of the $SiN_x$ layer where the device region is defined.

Figure 9B:
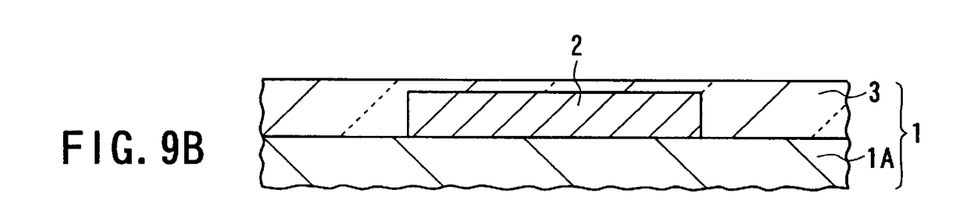

Next, the epitaxial layer 2 is oxidized by a pressure-oxidizing process using the patterned $SiN_x$ layer as a mask. Thus, as shown in FIG. 9B, the $SiO_2$ layer 3 with a thickness of approximately 1 μm is selectively formed on the base 1A. The top of the remaining epitaxial layer 2 is slightly oxidized in this process and as a result, the top of the this layer 2 also is covered with the $SiO_2$ layer 3. The state at this stage is shown in FIG. 9B. The remaining epitaxial layer 2 has a thickness of 1 μm.

Figure 9C:
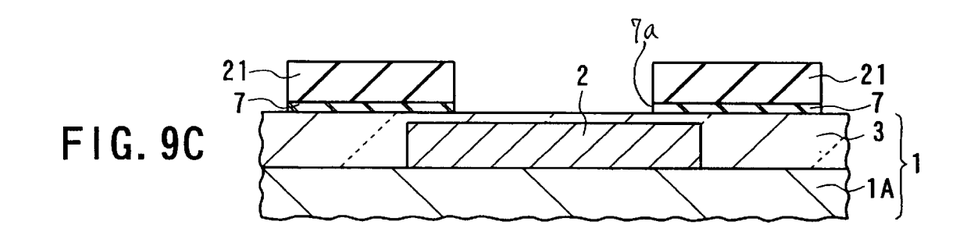

A polysilicon layer (not shown) is formed on the $SiO_2$ layer 3 by a LPCVD process and then, it is doped with arsenic (As) by an ion implantation process at an acceleration energy of 30 keV with a dose of $2 \times 10^{16}$ cm$^{-2}$. The n-type polysilicon layer thus formed is patterned by a dry etching process using a patterned photoresist film 21 by a photolithography process as a mask, thereby forming the conductive layer 7 serving as the shielding electrode, as shown in FIG. 9C. The conductive layer 7 has a rectangular window 7a. The photoresist film 21 is then removed.

Subsequently, the $SiO_2$ layer 8 with a thickness of 100 nm is deposited on the $SiO_2$ layer 3 by a LPCVD process to cover the conductive layer 7. A polysilicon layer (not shown) with a thickness of 200 nm is deposited on the $SiO_2$ layer 8 by a LPCVD process and then, it is doped with boron (B) by an ion implantation process at an acceleration energy of 20 keV with a dose of $5 \times 10^{15}$ cm$^{-2}$, thereby forming the p-type polysilicon base connection layer 9 on the $SiO_2$ layer 8. The $SiN_x$ layer 10 with a thickness of 100 nm is formed on the base connection layer 9 by a LPCVD process.

Figure 9D:
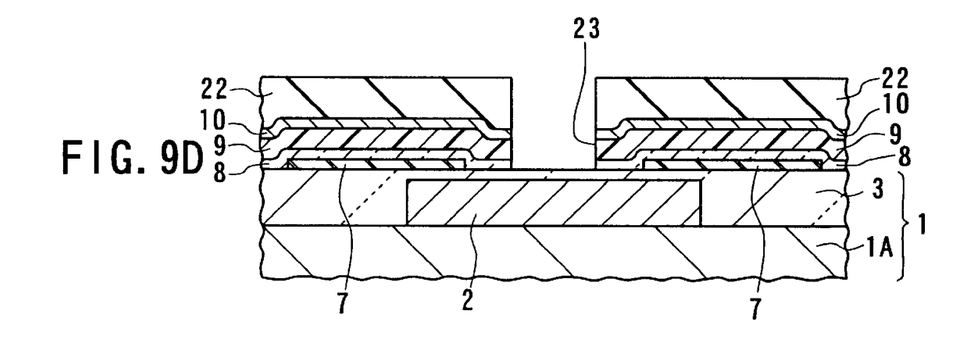
Figure 9E:
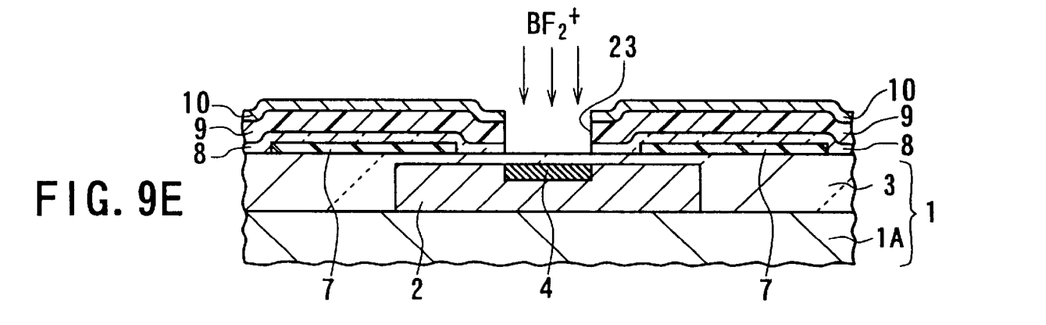

A photoresist film 22 is formed on the $SiN_x$ layer 10 and patterned by a photolithography process. Using the patterned photoresist film 22 as a mask, the $SiN_x$ layer 10, the base connection layer 9, and the $SiO_2$ layer 8 are selective removed by a Reactive-Ion Etching (RIE) process to form the base/emitter window 23 penetrating these layers 10, 9, and 8. The state at this stage is shown in FIG. 9D. The photoresist film 22 is then removed.

Further, boron difluoride ions ($BF_2^+$) are selectively implanted into the n-type epitaxial layer 4 through the base/emitter window 23 and the underlying isolation oxide 3 at an acceleration energy of 25 keV with a dose of $5 \times 10^{13}$ cm$^{-2}$. The ion-implanted epitaxial layer 4 is then subjected to an annealing process for activation, thereby forming the intrinsic (i.e., active) base region 4 in the epitaxial layer 2, as shown in FIG. 9D.

Figure 9F:
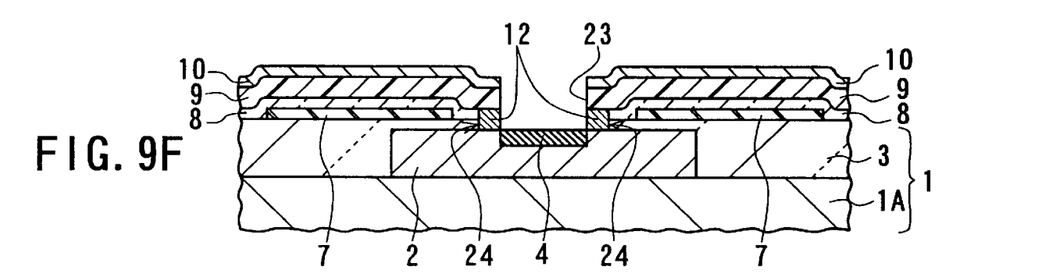

The $SiO_2$ layers 3 and 8 are selectively removed by a wet etching process using a mixture of ammonium fluoride ($NH_4F$) and hydrofluoric acid (HF) for a specific period. Thus, the $SiO_2$ layers 3 and 8 are laterally etched by a length of 250 nm, thereby forming a hollow space or vacancy 24 on the remaining epitaxial layer 2, as shown in FIG. 9F.

Following this, a polysilicon layer (not shown) with a thickness of 70 nm is grown on the $SiN_x$ layer 10 to cover the bas/emitter window 23 by a LPCVD process. The polysilicon layer thus grown is etched back by a RIE process, thereby forming the buried polysilicon layer 12 in the space or vacancy 24. The state at this stage is shown in FIG. 9F.

Figure 9G:
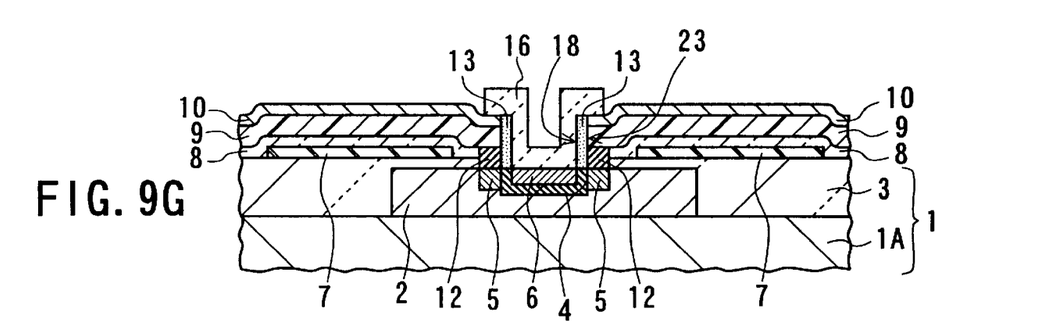

A $SiN_x$ layer (not shown) is formed on the $SiN_x$ layer 10 by a LPCVD process and then, it is etched back, thereby forming the $SiN_x$ layer 13 to cover the inner wall of the base/emitter window 23, as shown in FIG. 9G.

A polysilicon layer (not shown) with a thickness of 200 nm is grown on the SiN$_x$ layer 10 and then, it is doped with arsenic (As) by an ion implantation process. The n-type polysilicon layer thus formed is then patterned to form the emitter contact layer 16, as shown in FIG. 9G.

The substrate 1 is then subjected to a lamp annealing process at 100° C. for 10 seconds. Thus, the emitter region 6 is formed due to diffusion of the arsenic from the emitter contact layer 16 into the epitaxial layer 2. At the same time, the extrinsic base region 5 is formed due to diffusion of the boron from the buried polysilicon layer 12 into the epitaxial layer 2. The state at this stage is shown in FIG. 9G.

Following this process, the base connection layer 9 and the SiN$_x$ layer 10 are patterned to have a same plan shape, thereby determining the contour of the base connection layer 9 and the SiN$_x$ layer 10.

The SiO$_2$ layer 11 with a thickness of 400 nm is grown to cover the base connection layer 9 and the SiN$_x$ layer 10. The SiO$_2$ layer 11 is then patterned by photolithography and etching processes to form the contact holes 17, 19, and 20.

A metal layer with a thickness of 1 μm, which is made of aluminum (Al) or an aluminum alloy introduced by copper (Cu) or silicon (Si), is formed on the SiO$_2$ layer 11. The metal layer is then patterned to form the emitter and base electrodes 15 and 14. The emitter electrode 15 is contacted with the emitter contact layer 16 and the shielding electrode 7 through the contact holes 19 and 20, respectively. The base electrode 14 is contacted with the base connection layer 9 through the contact hole 17.

With the semiconductor device according to the first embodiment, the conductive layer 7 serving as the shielding electrode is provided between the collector region 2 (i.e., the epitaxial layer) and the base connection region 9. Therefore, the parasitic capacitance between the collector region 2 and the base connection layer 9 is prevented from occurring due to the Faraday shielding effect.

Thus, the parasitic capacitance between the base connection layer 9 and the collector region 2 is decreased. This means that the power gain of the bipolar transistor in the HF frequency range is increased.

To confirm the advantages of the present invention, the inventor performed the tests under the following condition.

Two parallel-connected bipolar transistors having the structure according to the first embodiment of the present invention were fabricated. At the same time, two parallel-connected bipolar transistors having the conventional structure which is the same as the first embodiment except that the shielding electrode 7 was not provided were practically fabricated. Each of the transistors had a square emitter region of 0.4 μm×20 μm.

As a result, in the transistors with the conventional structure, the parasitic capacitance between the collector region 2 and the base connection layer 9 was 34 fF, and the capacitance of the base-collector junction was 36 fF. Therefore, the total collector-base capacitance was 70 fF.

On the other hand, in the transistors according to the first embodiment, the parasitic capacitance between the collector region 2 and the base connection layer 9 was approximately zero (0) fF, and the capacitance of the base-collector junction was 36 fF. Therefore, the total collector-base capacitance was limited to 36 fF.

Figure 10:
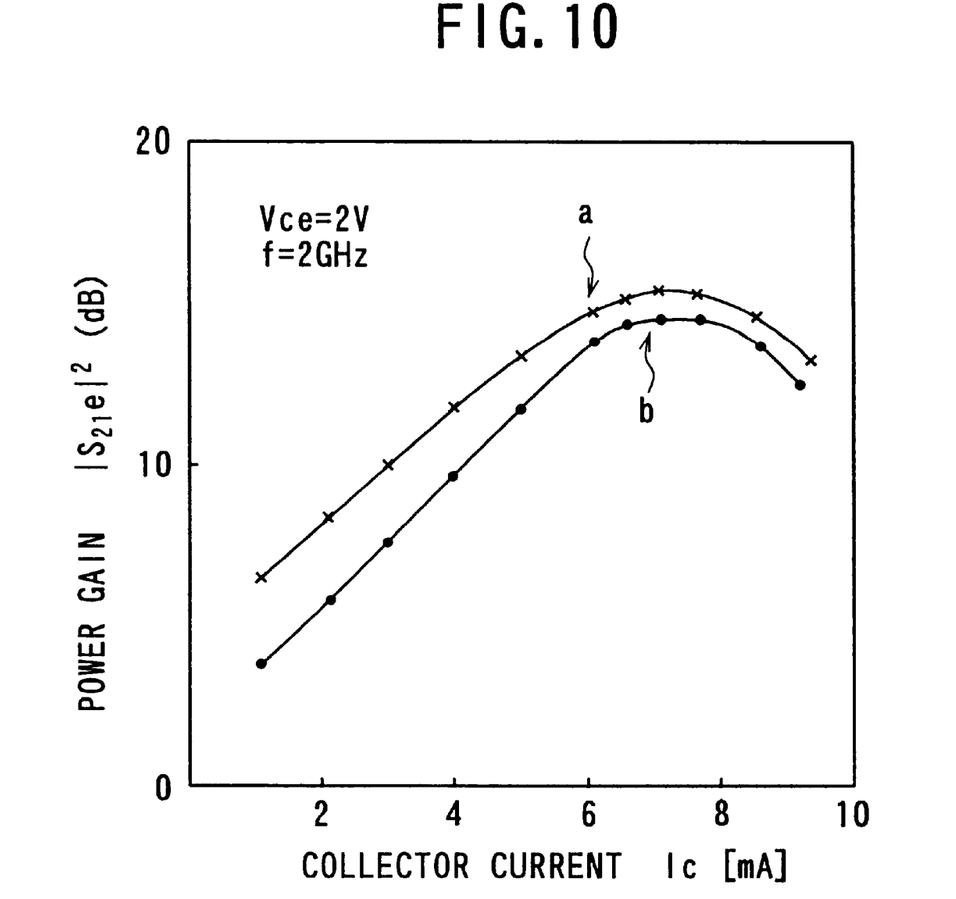
FIG. 10 is a graph showing the relationship of the power gain in the HF range with respect to the collector current of the semiconductor device according to the first embodiment of FIGS. 6 to 8 and a conventional semiconductor device.

Because of the difference in the total collector-base capacitance, it was found that the power gain in the HF range varied with respect to the collector current Ic, as shown in FIG. 10, where the collector-base voltage Vce was 2V and the signal frequency was 2 GHz, In FIG. 10, the curve a indicates the semiconductor device according to the first embodiment and the curve b indicates the conventional semiconductor device. The power gain $|S_{21e}|^2$ in the HF range was raised by 2 dB at a low collector current of Ic=2 mA, and it was raised by 1 dB at the maximum collector current.

Although the total collector-base capacitance can be decreased in the present invention, the emitter-base capacitance is increased by the shielding electrode 7. However, almost all of the total emitter-base capacitance is due to the capacitance of the emitter-base junction in the substrate 1. Therefore, even if the emitter-base capacitance is increased by the shielding electrode 7, the transistor characteristics or performance is scarcely affected by the increase of the emitter-base capacitance, and it is largely affected by the decrease of the collector-base capacitance.

If the semiconductor device according to the first embodiment is applied to a HF low-noise amplifier such as a microwave amplifier, the necessary number of stages of this amplifier can be reduced, resulting in the decreased parts number.

SECOND EMBODIMENT

Figure 11:
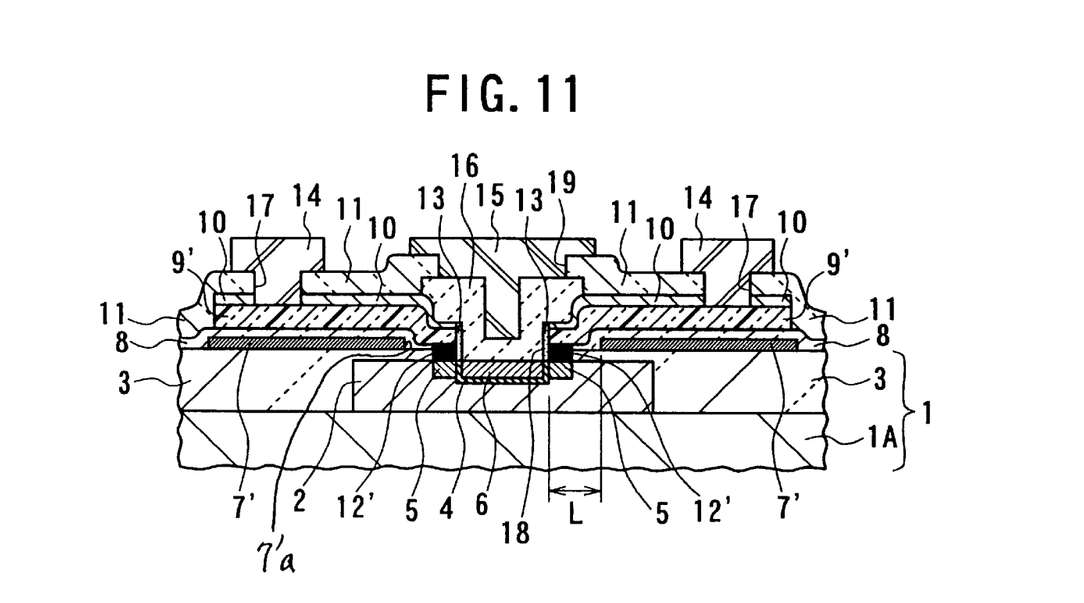
FIG. 11 is a partial cross-sectional view of a semiconductor device according to a second embodiment of the present invention, which is along the same line VII—VII in FIG. 6.
Figure 12:
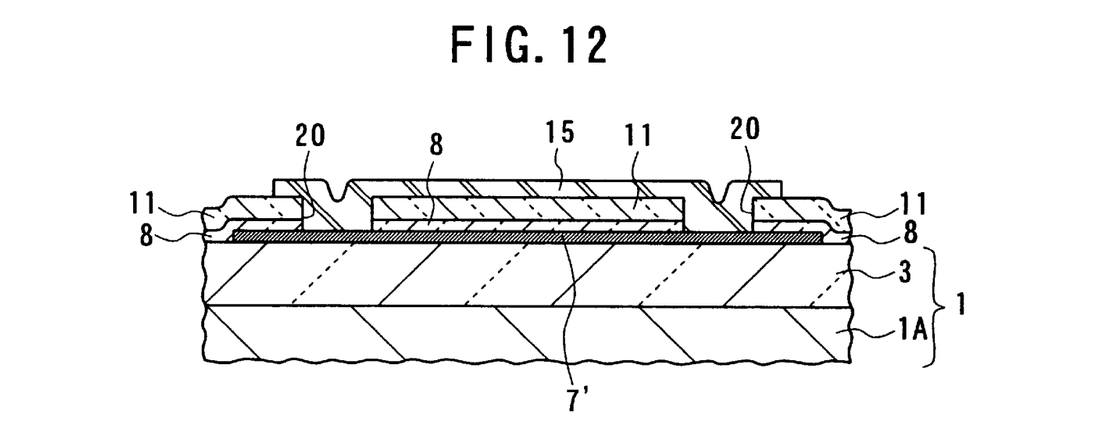
FIG. 12 is a partial cross-sectional view of the semiconductor device according to the second embodiment of the present invention, which is along the same line VIII—VIII in FIG. 6.

FIGS. 11 and 12 show a semiconductor device according to a second embodiment of the present invention, which has the same configuration as that of the first embodiment except that the polysilicon layer 7 serving as the shielding electrode is replaced with a metal silicide layer 7' and the buried polysilicon layer 12 is replaced with a buried metal silicide layer 12'.

Therefore, explanation about the second embodiment is omitted here for the sake of simplification of description.

It is obvious that the semiconductor device according to the second embodiment has the same advantages as those in the first embodiment.

It is preferred that the metal silicide layer 7' and the buried metal silicide layer 12' have a thickness of approximately 100 nm.

In general, a metal silicide layer is readily formed by a sputtering process and the doping process is unnecessary. Therefore, there is an additional advantage that the number of the necessary process steps can be reduced compared with the first embodiment.

There is another additional advantage that the electric resistance is lower than the first embodiment due to the lower electric resistance of the metal silicide.

THIRD EMBODIMENT

Figure 13:
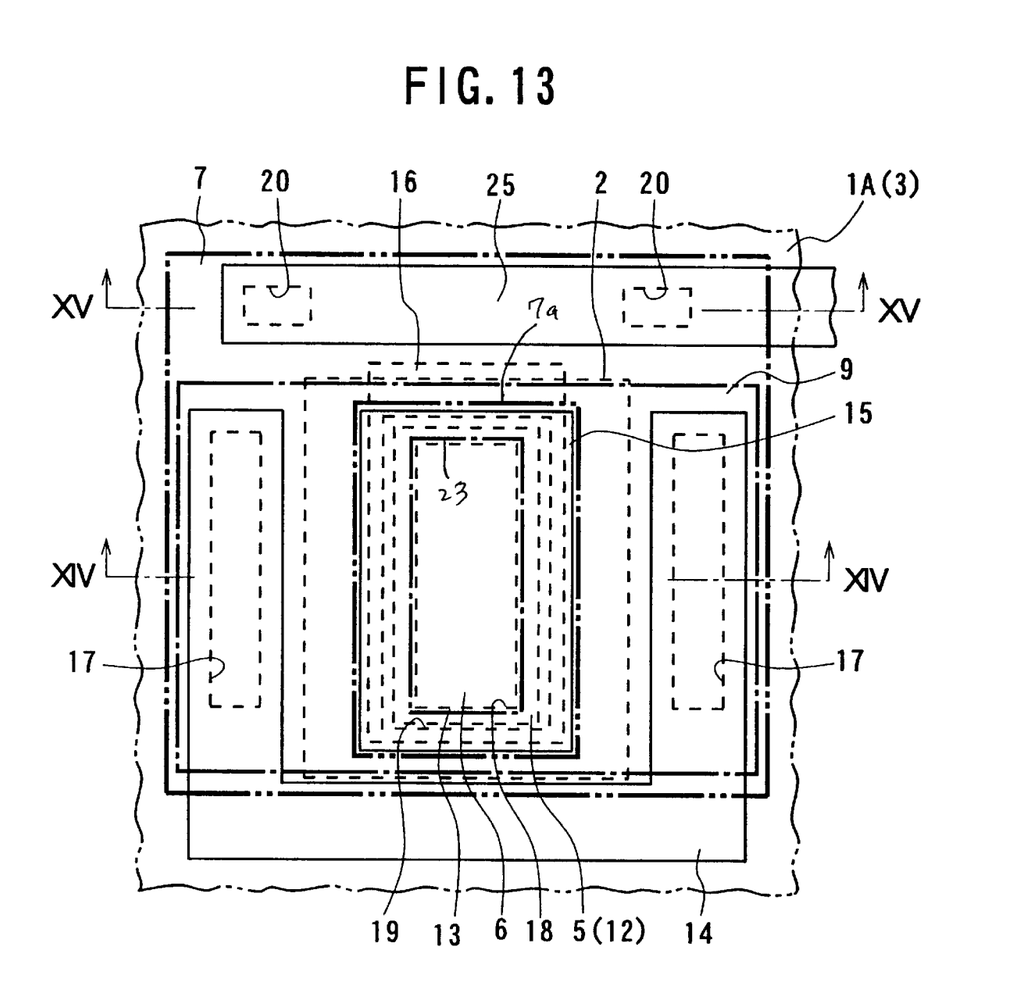
FIG. 13 is a partial plan view of a semiconductor device according to a third embodiment of the present invention.
Figure 14:
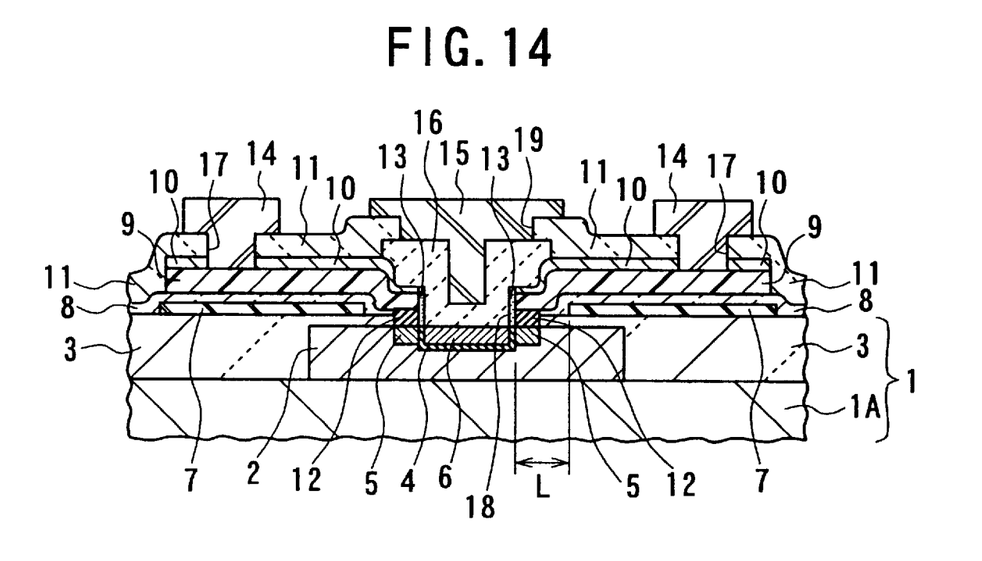
FIG. 14 is a partial cross-sectional view of a semiconductor device according to the third embodiment of FIG. 13, which is along the line XIV—XIV in FIG. 13.
Figure 15:
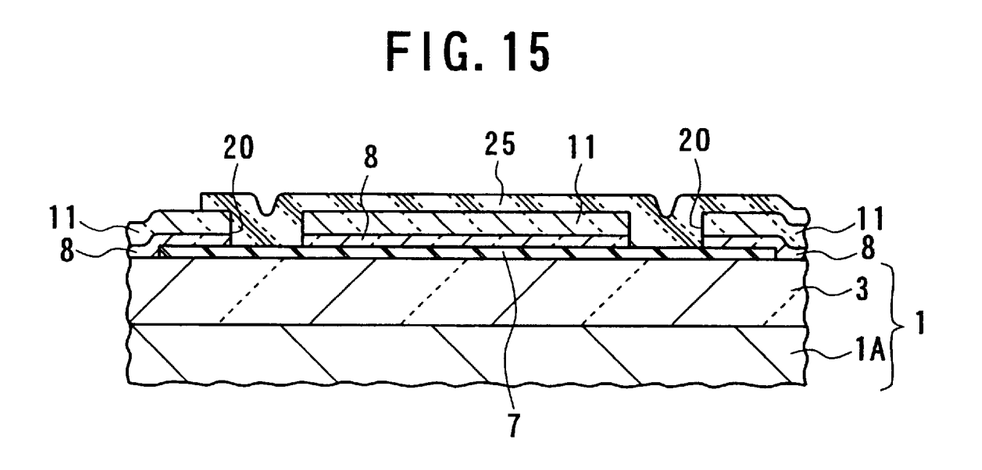
FIG. 15 is a partial cross-sectional view of the semiconductor device according to the third embodiment of FIG. 13, which is along the line XV—XV in FIG. 13.

FIGS. 13 to 15 show a semiconductor device according to a third embodiment of the present invention, which has the same configuration as that of the first embodiment except that the conductive layer 7 serving as the shielding electrode is not electrically connected to the emitter region 6 but to a power supply line $V_{SS}$ through a wiring line 25.

Therefore, explanation about the third embodiment is omitted here for the sake of simplification of description.

It is obvious that the semiconductor device according to the third embodiment has the same advantages as those in the first embodiment.

Although the present invention is applied to an npn-type bipolar transistor having the configuration shown in the attached figures, it is needless to say that the present invention may be applied to any other type of bipolar transistors.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor device comprising:

a semiconductor substrate having a main surface;

a collector region formed in said substrate;

a base region formed in said substrate;

an emitter region formed in said substrate;

a first dielectric layer formed on the main surface of said substrate to be overlapped with said collector region;

a conductive layer formed on said first dielectric layer and applied with a specific electric potential;

a second dielectric layer formed to cover said conductive layer;

a base connection layer formed on said second dielectric layer and electrically connected to said base region; and a base electrode electrically connected to said base connection layer;

wherein said emitter region, said base region, and said collector region constitute a bipolar transistor;

and wherein said conductive layer serves as a shielding electrode that prevents a parasitic capacitance between said collector region and said base connection layer from occurring using the Faraday shielding effect.

2. The device as claimed in claim 1, wherein said base region is comprised of a first part serving as an intrinsic base and a second part serving as an extrinsic base;

and wherein said base connection layer is electrically connected to said second part of said base region, said base connection layer is formed to surround said first part of said base region, and said emitter region and said collector region are contacted with said first part of said base region.

3. The device as claimed in claim 2, wherein said second part of said base region is formed to surround said first part of said base region.

4. The device as claimed in claim 1, wherein said base connection layer is entirely overlapped with said conductive layer except for a neighborhood of said base connection layer with said base region;

and wherein said neighborhood of said base region surrounds said base region.

5. The device as claimed in claim 4, wherein said neighborhood of said base region has a width L equal to or greater than 1 $\mu$m.

6. The device as claimed in claim 1, wherein said base connection layer is electrically connected to said emitter region.

7. The device as claimed in claim 1, wherein said base connection layer is electrically connected to a power supply line or a ground line.

8. The device as claimed in claim 1, wherein said base connection layer is made of polysilicon or a metal silicide.

9. The device as claimed in claim 1, wherein said base connection layer is made of one selected from the group consisting of a silicide of tungsten (W), titanium (Ti), and platinum-rhodium alloy (Pt-Rh).

10. The device as claimed in claim 1, wherein said first dielectric layer is made of one selected from the group consisting of silicon oxide ($SiO_x$), silicon nitride ($SiN_x$), and a combination of silicon oxide ($SiO_x$) and silicon nitride ($SiN_x$).

* * * * *